(12) United States Patent
Copel et al.

(10) Patent No.: US 10,170,702 B2
(45) Date of Patent: Jan. 1, 2019

(54) INTERMETALLIC CONTACT FOR CARBON NANOTUBE FETS

(71) Applicant: INTERNATIONAL BUSINESS MACHINES CORPORATION, Armonk, NY (US)

(72) Inventors: Matthew W. Copel, Yorktown Heights, NY (US); Damon B. Farmer, White Plains, NY (US); Talia S. Gershon, White Plains, NY (US); Paul M. Solomon, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/404,736

(22) Filed: Jan. 12, 2017

(65) Prior Publication Data

US 2018/0198070 A1     Jul. 12, 2018

(51) Int. Cl.
*H01L 51/00* (2006.01)
*H01L 51/05* (2006.01)

(52) U.S. Cl.
CPC ...... *H01L 51/0048* (2013.01); *H01L 51/0021* (2013.01); *H01L 51/0537* (2013.01); *H01L 51/0545* (2013.01); *H01L 51/0558* (2013.01)

(58) Field of Classification Search
CPC .......... H01L 51/0048; H01L 51/0021; H01L 51/0537; H01L 51/0558; H01L 51/0545
See application file for complete search history.

(56) References Cited

U.S. PATENT DOCUMENTS

| | | | |
|---|---|---|---|
| 6,191,433 B1 * | 2/2001 | Roitman | H01L 27/3281 257/40 |
| 6,544,357 B1 | 4/2003 | Hehmann et al. | |
| 7,160,525 B1 | 1/2007 | Peng et al. | |
| 7,180,107 B2 | 2/2007 | Appenzeller et al. | |
| 7,687,801 B2 | 3/2010 | Hiura et al. | |
| 8,513,741 B2 | 8/2013 | Keshavarzi et al. | |
| 8,816,328 B2 | 8/2014 | Chang et al. | |
| 8,822,352 B1 | 9/2014 | Derderian et al. | |
| 9,203,030 B2 | 12/2015 | Kppelen et al. | |
| 9,355,916 B2 | 5/2016 | Kondo et al. | |
| 9,577,204 B1 * | 2/2017 | Han | H01L 51/0558 |
| 2002/0036599 A1 | 3/2002 | Nishimura et al. | |
| 2002/0197456 A1 | 12/2002 | Pope | |
| 2004/0104660 A1 * | 6/2004 | Okamoto | B82Y 10/00 313/346 R |

(Continued)

FOREIGN PATENT DOCUMENTS

| | | | | |
|---|---|---|---|---|
| DE | 102010010658 A1 | 9/2011 | | |
| GB | 2498525 A * | 7/2013 | ......... | H01L 29/1602 |

OTHER PUBLICATIONS

Javey, A. et al., "Ballistic carbon nanotube field-effect transistors" Nature (Aug. 2003) pp. 654-657, vol. 424.

(Continued)

*Primary Examiner* — Bitew Dinke
(74) *Attorney, Agent, or Firm* — Tutunjian & Bitetto, P.C.; Vazken Alexanian

(57) ABSTRACT

A field effect transistor includes a carbon nanotube layer formed adjacent to a gate structure. Two intermetallic contacts are formed on the carbon nanotube layer. The two intermetallic contacts include an oxidation resistant compound having a work function below about 4.4 electron-volts.

16 Claims, 5 Drawing Sheets

(56) References Cited

U.S. PATENT DOCUMENTS

| | | | | |
|---|---|---|---|---|
| 2005/0093098 A1* | 5/2005 | Hirose | C30B 25/02 | 257/615 |
| 2006/0038179 A1* | 2/2006 | Afzali-Ardakani | B82Y 10/00 | 257/67 |
| 2006/0063318 A1* | 3/2006 | Datta | B82Y 10/00 | 438/197 |
| 2006/0214182 A1* | 9/2006 | Udagawa | H01L 21/28575 | 257/103 |
| 2007/0108453 A1* | 5/2007 | Udagawa | H01L 21/28575 | 257/85 |
| 2008/0030117 A1 | 2/2008 | Chen et al. | | |
| 2009/0032804 A1* | 2/2009 | Kalburge | B82Y 10/00 | 257/24 |
| 2009/0104746 A1* | 4/2009 | Clifton | H01L 29/0673 | 438/299 |
| 2009/0160306 A1 | 6/2009 | Xiao et al. | | |
| 2010/0044225 A1 | 2/2010 | Kim et al. | | |
| 2010/0181655 A1* | 7/2010 | Colombo | H01L 21/28255 | 257/635 |
| 2011/0114919 A1* | 5/2011 | Jenkins | H01L 29/78684 | 257/29 |
| 2011/0284818 A1* | 11/2011 | Avouris | B82Y 10/00 | 257/9 |
| 2012/0056161 A1* | 3/2012 | Avouris | H01L 29/1606 | 257/24 |
| 2013/0130037 A1* | 5/2013 | Bol | H01L 51/0048 | 428/408 |
| 2013/0143356 A1* | 6/2013 | Afzali-Ardakani | H01L 51/002 | 438/99 |
| 2014/0035059 A1* | 2/2014 | Giles | H01L 29/785 | 257/369 |
| 2014/0054551 A1 | 2/2014 | Afzali-Ardakani et al. | | |
| 2014/0057425 A1* | 2/2014 | Afzali-Ardakani | H01L 29/45 | 438/594 |
| 2014/0120714 A1* | 5/2014 | Farmer | H01L 21/02603 | 438/610 |
| 2014/0152330 A1* | 6/2014 | Afzali-Ardakani | B82Y 30/00 | 324/693 |
| 2014/0353590 A1* | 12/2014 | Cao | H01L 29/66742 | 257/29 |
| 2015/0034908 A1* | 2/2015 | Meade | H01L 29/1606 | 257/27 |
| 2015/0214304 A1* | 7/2015 | Park | H01L 29/1606 | 257/29 |
| 2015/0287942 A1* | 10/2015 | Cao | H01L 51/0541 | 257/347 |
| 2016/0049475 A1* | 2/2016 | Bol | H01L 29/1606 | 257/29 |
| 2017/0133468 A1* | 5/2017 | Colombo | H01L 29/1606 | |

OTHER PUBLICATIONS

Kumari, M. et al., "Improving the field emission of carbon nanotubes by lanthanum-hexaboride nanoparticles decoration" Applied Physics Letter (2012) pp. 123116-1-123116-5, vol. 101.

Patra, R. et al., "Enhanced field emission from lanthanum hexaboride coated multiwalled carbon nanotubes: Correlation with physical properties" Journal of Applied Physics (Oct. 2014) pp. 164309-1-164309-6, vol. 116.

Shahrjerdi, D. et al., "High-Performance Air-Stable n-Type Carbon Nanotube Transistors with Erbium Contacts" ACS Nano (Sep. 2013) pp. 8303-8308, vol. 7, No. 9.

Tulevski, G.S. et al., "Chemically Assisted Directed Assembly of Carbon Nanotubes for the Fabrication of Large-Scale Device Arrays" J. Am. Chem. Soc. (Sep. 2007) pp. 11964-11968, vol. 129, No. 39.

Wang, C. et al., "Metal Contact Engineering and Registration-Free Fabrication of Complementary Metal-Oxide Semiconductor Integrated Circuits Using Aligned Carbon Nanotubes" ACS Nano (Jan. 2011) pp. 1147-1153, vol. 5, No. 2.

Wei, W. et al., "LaB6 tip-modified multiwalled carbon nanotube as high quality field emission electron source" Applied Physics Letters (Nov. 2006) pp. 203112-1-203112-3, vol. 89.

Yokoyama, M. et al., "Evaluation of LaB6 Thin Film as Low-Work-Function Gate for MOSFET Operated at Low Temperature" Japanese Journal of Applied Physics (Sep. 1990) pp. L1594-L1596, vol. 29, No. 9.

U.S. Office Action issued in U.S. Appl. No. 15/803,074 dated Sep. 21, 2018, 18 pages.

* cited by examiner

INTERMETALLIC CONTACT FOR CARBON NANOTUBE FETS

BACKGROUND

Technical Field

The present invention generally relates to carbon nanotube transistors, and more particularly to carbon nanotube field effect transistors employing intermetallic contacts and methods for fabrication.

Description of the Related Art

Circuits can employ carbon nanotubes (CNTs) for complementary metal oxide semiconductors (CMOS) having both electron carrier field effect transistors (nFETS) and hole carrier FETS (pFETs). For conventional semiconductor FETs, polarity of the carrier is determined by doping source/drain contacts, channel, and gate. CNT FETs function differently as the polarity of the carriers is determined by a work function of the source/drain contacts. For pFETs, a high work function metal, such as, Pd is commonly used. This works well, because high work function metals are chemically inert, so a stable contact can be obtained.

However, in making nFET devices, difficulties arise in using low work function metals. These materials react very strongly with oxygen, forming non-conducting oxides. This has two deleterious effects. By creating an insulating layer, a series resistance is added to the device, lowering the amount of current that can be transmitted. Also, by gettering oxygen from other insulators used in fabricating the device, leakage pathways are created, in particular, between a bottom gate and the source/drain contacts. The problem is especially acute when hafnium oxide is used as an insulator, which is reduced to a sub-oxide when contacted by, e.g., low work function metals.

SUMMARY

In accordance with an embodiment of the present invention, a field effect transistor includes a carbon nanotube layer formed adjacent to a gate structure. Two intermetallic contacts are formed on the carbon nanotube layer. The two intermetallic contacts include an oxidation resistant compound having a work function below about 4.4 electron-volts.

Another field effect transistor includes a substrate forming a back gate and a gate dielectric formed over the substrate. A carbon nanotube layer is formed on the gate dielectric and intermetallic contacts are formed on the carbon nanotube layer. The intermetallic contacts include a rare earth metal boride or a rare earth metal aluminide. A cladding layer is formed over the intermetallic contacts.

A method for forming a field effect transistor includes forming a gate dielectric on a gate electrode; forming a carbon nanotube layer on the gate dielectric; and forming intermetallic contacts on the carbon nanotube layer, the intermetallic contacts including an oxidation resistant compound having a work function below 4.4 electron-volts.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
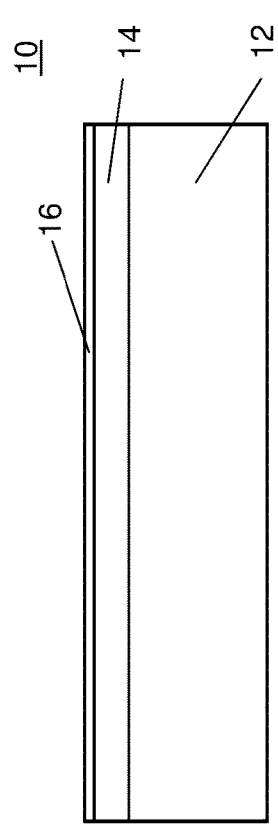
FIG. 1 is a cross-sectional view showing a layer of carbon nanotubes formed on an insulating layer over a gate electrode in accordance with an embodiment of the present invention.

In accordance with embodiments of the present invention, a carbon nanotube transistor (CNT) is provided that includes low work function material contacts that do not oxidize. While difficult to provide non-oxidizing or oxidation resistant contacts, intermetallic compound combinations and materials have been determined, which only form very thin surface oxides. In these embodiments, the oxidation is limited by using an alloy of two metals that form a highly dense structure, reducing diffusion. When diffusion is reduced, the atomic rearrangements needed for oxide formation are kinetically restricted, causing a barrier to oxidation.

Intermetallic compounds, such as, e.g., rare-earth borides (e.g., lanthanum boride, cerium boride and samarium boride) can be employed as contacts. In a field effect transistor (FET) application, electrons are injected into a carbon nanotube (CNT), traverse a gated region, and are then collected from the CNT. The intermetallic compound is deposited on top of the CNT, so that the CNT-intermetallic interface is not exposed to air.

In useful embodiments, effective work functions for $LaB_6$ and $LaAl_2$ are in the range of about 3.6 to 3.7 eV, and have low oxidation rates far below a pure lanthanum control sample to provide low work functions and improved resistance to oxidation. In particularly useful embodiments, effective work functions in the range of about 3.3 to 3.6 eV were achieved for $LaB_6$ and $LaAl_2$ with low oxidation rates. Low oxidation rates, oxidation resistant compound, non-oxidizing or oxidation resistant contacts all refer to intermetallic materials having improved oxidation characteristics as compared to pure lanthanum (e.g., the control sample).

For FETs, a CNT channel can be contacted in at least two places by a low work function intermetallic. The intermetallic can include a rare earth boride or other boride. Lanthanum, cerium and samarium borides are particularly useful. In addition, a rare-earth aluminide can be employed, such as lanthanum aluminide, europium aluminide or strontium aluminide. The FET structure can include CNT in a structure that includes a gate to modulate current flow, separated from the CNT by an insulating layer. In some embodiments, the insulator can include hafnium oxide, aluminum oxide, silicon oxide, zirconium oxide, or other metal oxide. The gate may be over or underneath the CNT, e.g., with the contacts formed on top of the CNT.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a partially fabricated transistor device 10 is illustratively shown in accordance with one embodiment. The device 10 includes a substrate 12. The substrate 12 can include any suitable substrate structure, e.g., a bulk semiconductor, a semiconductor-on-insulator (SOI) substrate, etc. In one example, the substrate 12 can include a silicon-containing material. Illustrative examples of Si-containing materials suitable for the substrate 12 can include, but are not limited to, Si, SiGe, SiGeC, SiC, polysilicon, amorphous Si and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride, zinc selenide, etc.

In one embodiment, the substrate 12 is configured (e.g., doped) to form a back gate for the device 10. In other embodiments, a conductive structure or conductive layers can be formed to provide a gate electrode. The substrate 12 or gate electrode includes a gate dielectric or insulating layer 14 formed thereon. The gate dielectric 14 can include an oxide of the substrate 12 or can include a deposited dielectric layer. The gate dielectric 14 can include an oxygen containing compound, e.g., hafnium oxide, aluminum oxide, silicon oxide, zirconium oxide or other metal oxide, since oxidation resistance is increased in to be formed intermetallic contacts. The gate dielectric 14 can include a thickness of between about 2 nm to about 30 nm.

A thin film of carbon nanotubes (CNTs) 16, and, in particular, highly purified CNTs are placed, grown or assembled onto the gate dielectric or insulating layer 14. In one embodiment, the CNT thin film 16, is placed in a controlled manner onto plastic substrates with transfer printing techniques. High-quality CNTs placed on transfer substrates are obtained. The CNT thin films can be placed by a transfer process from the transfer substrate to the insulating layer 14. In other embodiments, the CNTs 16 are formed using directed self-assembly techniques. Any suitable formation techniques can be employed. In some embodiment, the formation of the CNTs 16 is combined with the patterning of the CNTs 16.

Figure 2:
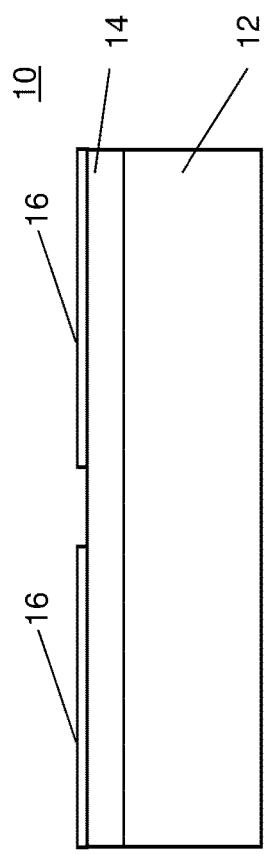
FIG. 2 is a cross-sectional view showing the device of FIG. 1 having the layer of carbon nanotubes patterned on the insulating layer in accordance with an embodiment of the present invention.

Referring to FIG. 2, the CNT layer 16 can be patterned in a number of ways. One way includes a pre-growth method, the growth of CNTs is restricted to certain regions by patterning catalyst particles or the like. Pre-growth patterning ensures pristine CNT thin films. In a pre-growth method, a catalyst can be patterned by photolithography and CNTs are grown after the lift-off.

Another way to pattern the CNTs 16 includes a post-growth method. In the post-growth method, the CNT thin film 16 is selectively removed after growth. The CNT film 16 can be transferred from, e.g., SiO$_2$ to thermoplastics (e.g., polyterephthalate (PET)) and metallic substrates (e.g., Au and Pd) or be grown in place. In a post-growth method, a photoresist is patterned on CNTs and exposed CNTs are etched by reactive ion etching (RIE) in, e.g., an O$_2$ plasma.

In another embodiment, the CNT layer 16 is chemically attached to the dielectric 14 in the desired areas in a chemically assisted directed assembly process of carbon nanotubes. In such as process, CNTs are chemically functionalized through diazonium chemistry with a hydroxamic acid end group that both renders single-walled carbon nanotubes (SWCNTs) water-soluble and discriminately binds the CNTs 16 to basic metal oxide surfaces (e.g., hafnium oxide (HfO$_2$)) of the insulating layer 14. The functionalized SWCNTs are then assembled from an aqueous solution into narrow trenches etched into, e.g., SiO$_2$ films with HfO$_2$ at the bottom. The side walls of the patterned trenches induce alignment of the CNTs 16 along the length of the trenches. Heating the structures to about 600 degrees C. removes the organic moieties, leaving pristine CNTs 16.

Figure 3:
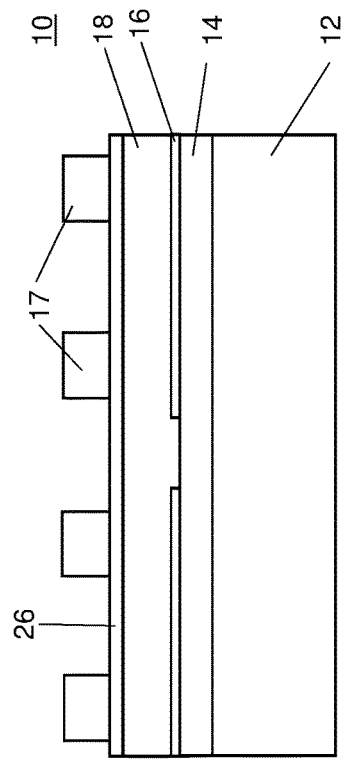
FIG. 3 is a cross-sectional view showing the device of FIG. 2 having an intermetallic layer formed on the carbon nanotubes, an optional cladding layer formed on the intermetallic layer and an etch pattern formed on the cladding layer (or intermetallic layer) for etching intermetallic contacts in accordance with one embodiment of the present invention.

Referring to FIG. 3, after formation and patterning of the CNT layer 16, in one embodiment, an intermetallic layer 18 is formed in accordance with embodiments of the present invention. The intermetallic layer 18 can be formed by depositing the intermetallic layer 18 on the CNT layer 16. The intermetallic layer 18, preferably includes a low work function material. A low work function includes, e.g., a work function less than about 4.4 eV, preferably less than about 3.6 eV. The intermetallic layer 18 can include a rare earth boride or other boride, and in particular, lanthanum boride, cerium boride and/or samarium boride. In other embodiments, a rare-earth aluminide can be employed, such as, e.g., lanthanum aluminide, europium aluminide and/or strontium aluminide. These materials include oxidation resistant compounds that include oxidation resistance better than La. The intermetallic layer 18 can have thickness of between about 4 nm to about 20 nm. Other thicknesses may also be employed.

The intermetallic layer 18 can be formed by sputtering, evaporation, physical vapor deposition (PVD), chemical vapor deposition (CVD) or any other suitable process. The formation of the intermetallic layer 18 can include the use of at least two elemental sources (e.g. La and B to form LaB$_6$ or La and Al to form LaAl$_2$) in a vacuum chamber which are mixed during the formation of the intermetallic layer 18. Compounds with three or more elements are also contemplated.

In some embodiments, LaB$_6$ is a good candidate due to its use as an electron source. LaB$_6$ has vacuum work function of about 2.5 eV with an effective work function between about 3.5 to about 3.7 eV. LaB$_6$ is resistant to oxidation and is usually sputter deposited or E-beam evaporated from a LaB$_6$ target.

In useful embodiments, a capping layer 26 can be formed over the intermetallic layer 18. The capping layer can include Al, Ti, others metals or combinations of these and other metals. In one embodiment, the capping layer 26 includes a Ti adhesion layer followed by an Al layer formed on the Ti adhesion layer. The capping layer 24 permits an interface that is more compatible with convention processing. Processing can continue with the formation of dielectric layers.

The intermetallic layer 18 and optional capping layer 26 is patterned to form contacts (20, FIG. 5) on the CNT layer 16. A resist material 17 (or hard mask patterned with the resist material 17) is developed into shapes or patterns. The resist provides an etch mask for etching (e.g., by RIE) contacts into the capping layer 26 and the intermetallic layer 18. The hard mask or resist material 17 can be deposited and lithographically patterned into shapes for the formation of source and drain regions. In a particularly useful embodiment, a lift-off process may be employed to better protect the CNTs 16 from damage over plasma patterning processes as depicted in FIG. 4.

Figure 4:
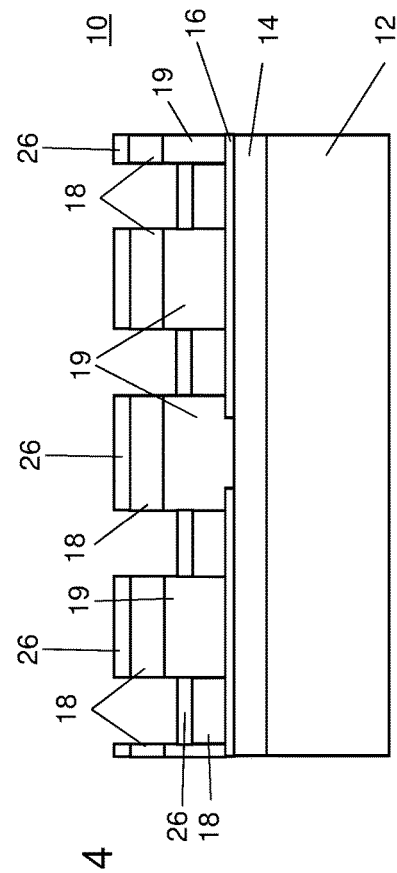
FIG. 4 is a cross-sectional view showing the device of FIG. 2 having the intermetallic layer formed over a resist material with an optional cladding layer formed on the intermetallic layer to form contacts on the carbon nanotubes by a lift-off process in accordance with another embodiment of the present invention.

Referring to FIG. 4, in another embodiment, the intermetallic layer 18 is patterned to form contacts on the CNT layer 16 by a lift-off process. In a particularly useful embodiment, the intermetallic layer 18 and a capping layer 26 are patterned by a lift-off technique. Prior to deposition, a resist material 19 such as polymethylmethacrylate (PMMA) is developed into shapes or patterns. Alternatively, a hard mask material can be used to provide greater thermal stability. The intermetallic layer 18 is deposited in a blanket film, covering both the resist pattern 19 (or hard mask pattern), and portions of the CNT layer where the resist (or hardmask) 19 has been removed. The capping layer 26 can also be formed over the intermetallic layer 18. The capping layer can include Al, Ti, others metals or combinations of these and other metals. In one embodiment, the capping layer 26 includes a Ti adhesion layer followed by an Al layer formed on the Ti adhesion layer. The capping layer 24 permits an interface that is more compatible with convention processing. Processing can continue with the formation of dielectric layers.

After deposition of the intermetallic layer 18 and the optional capping layer 26, the resist 19 is dissolved, leaving contacts 20 (FIG. 5) where the resist was absent. The lift-off process better protects the CNTs 16 from plasma damage.

Figure 5:
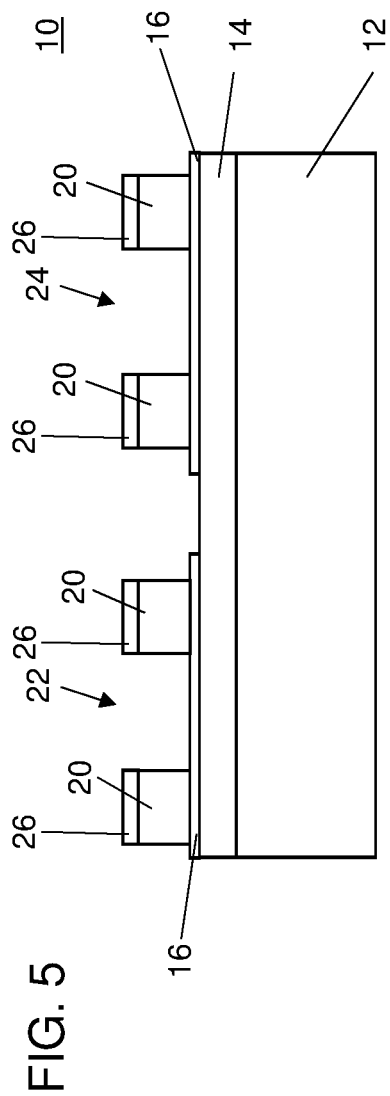
FIG. 5 is a cross-sectional view showing the device of FIG. 3 or 4 having the intermetallic contacts formed in accordance with an embodiment of the present invention.

Referring to FIG. 5, the device 10 forms a FET structure that includes a gate (substrate 12) to modulate current flow, separated from the CNT channel layer 16 by the insulating layer 14. The structure shown in FIG. 5 can be from either FIG. 3 or FIG. 4. In some embodiments, the gate 12 can be underneath the CNT 16, with the contacts 20 formed on top of the CNT 16. In other embodiments, the gate can be formed on top of the substrate 12 using conductive layers. Other structures are also contemplated.

In useful embodiments, effective work functions for the intermetallic contacts 20 are in the range of below about 4.4 eV (e.g., $LaAl_2$ with an effective work function of about 4.2 eV) and preferably below 3.7 eV, and more preferably below 3.5 eV. In some embodiments, the work functions for the intermetallic contacts 20 are equal to or below about 3.3 eV. In illustrative embodiments, effective work functions for the intermetallic contacts 20 can include $SrAl_x$ or $EuAl_x$, where, e.g., $SrAl_4$ has an effective work function of about 3.05 eV and $EuAl_2$ has an effective work function of about 3.3 eV.

The intermetallic contacts 20 have low oxidation rates far below a pure lanthanum control sample to provide improved resistance to oxidation. For FETs, a CNT channel 16 can be contacted in at least two places by the low work function intermetallic contacts 20. The intermetallic contacts 20 provide source and drain regions/contacts for a FET formed with the CNT layer acting as a channel. When the gate (substrate 12) is activated, conduction occurs through the channel (CNT 16) between contacts 20 for each FET 22, 24. While intermetallic contacts 20 can be employed with positive carrier FETs (pFETs), the material with a low work function and a low oxidation rate is particularly useful for negative carrier FETs (nFETs).

It should be understood that while the FIGS. show an illustrative structure, the structure can be configured to include separated gates for each device, pFET and nFET devices side by side (as in a CMOS configuration), a shared contact between adjacent devices, etc.

The capping layer 26 can be formed over the intermetallic contacts 20 to provide an interface that is more compatible with convention processing. Processing can continue with the formation of dielectric layers. The dielectric layers can be processed to form trenches for the formation of metallization structures or other connection structures or components.

Figure 6:
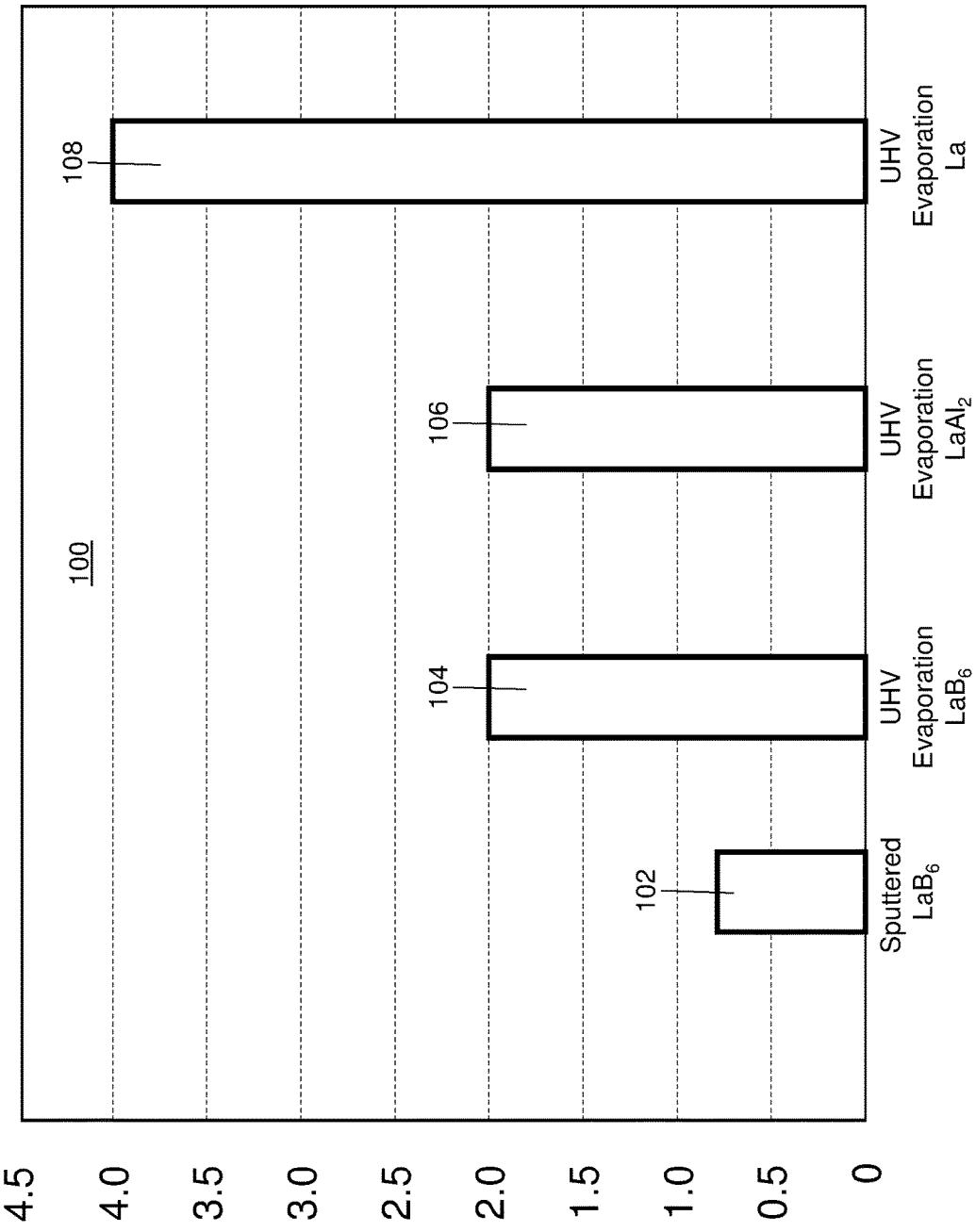
FIG. 6 is a bar chart comparing oxide thickness of sputtered $LaB_6$, evaporated $LaB_6$, evaporated $LaAl_2$ and evaporated La (e.g., grown by evaporation in ultra-high vacuum) for comparison to demonstrate oxidation resistance in accordance with an embodiment of the present invention.

Referring to FIG. 6, improvements in oxidation resistance were tested for a plurality of different formation processes and structures. The structures included $LaB_6$ and $LaAl_2$, which were compared with La as a comparison point. Bar chart 100 of FIG. 7 shows native oxide thicknesses (nm) for materials formed by different processing techniques after approximately 40 minutes of air exposure.

Bar 102 shows a thickness of about 0.7 nm for a sputtered $LaB_6$. Bar 104 shows a thickness of about 2.0 nm for a $LaB_6$ contact formed by evaporation in ultra-high vacuum (UHV). Bar 106 shows a thickness of about 2.0 nm for a $LaAl_2$ contact formed by evaporation in ultra-high vacuum. Bar 108 shows a thickness of about 4.0 nm for elemental La formed by evaporation in ultra-high vacuum. The bar chart 100 shows that alloys provided in accordance with the present embodiments are significantly less reactive and provide better oxidation resistance as compared to the native oxide thickness and response of La (bar 108).

Figure 7:
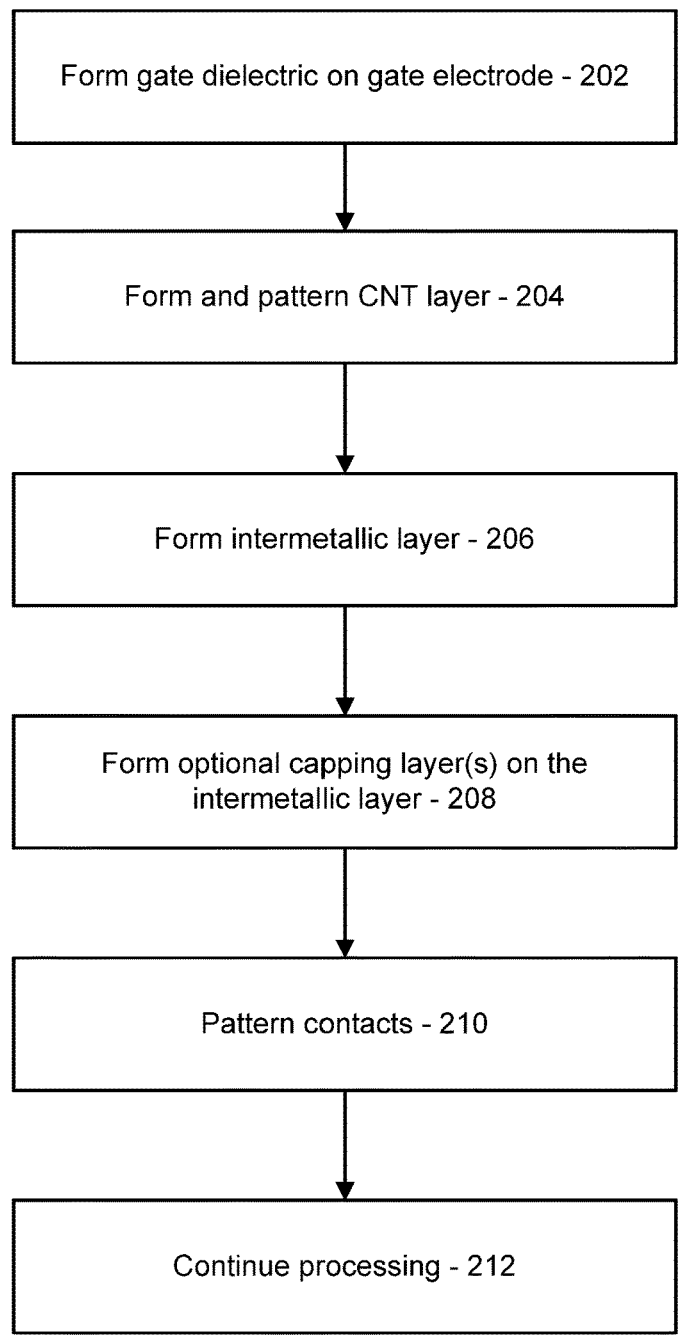
FIG. 7 is a block/flow diagram showing methods for forming a carbon nanotube field effect transistor with intermetallic contacts in accordance with embodiments of the present invention.

Referring to FIG. 7, methods for forming a field effect transistor are illustratively shown in accordance with the present embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, a gate dielectric is formed on a gate electrode. The gate electrode can include a doped substrate or can include a patterned or unpatterned metal layer. In other embodiments, the gate electrode and gate dielectric can be formed after other components of the device are formed.

In block 204, a carbon nanotube (CNT) layer is provided on the gate dielectric. The CNT layer can be formed in place or transferred to the insulator layer. The CNT layer can be selectively adsorbed to preferred regions of the substrate. The CNT layer can be patterned during formation or by forming a patterned mask and etching the CNT layer. Prior to deposition of the contacts, a mask layer may be applied and patterned to allow contacts in desired regions.

In block 206, an intermetallic layer is formed on the carbon nanotube layer. The intermetallic layer can include an oxidation resistant compound having a work function below 4.4 electron-volts for electron carrier FETs. The intermetallic layer can include a material selected from the group consisting of lanthanum boride, cerium boride, samarium boride, lanthanum aluminide, europium aluminide and strontium aluminide. Other metal or real earth metal borides or aluminides can also be employed. The intermetallic layer can be formed by sputtering, E-beam evaporation, UHV evaporation, etc.

One method of creating intermetallic layer is by evaporation from elemental sources. The constituents (e.g., La and Al, or La and boron) are placed in separate evaporative sources, such as Knudsen cells. Independent sources permit evaporation at a lower temperature than trying to evaporate the intermetallic compound. The sources are placed in a vacuum system, preferably one capable of ultra-high vacuum to avoid oxygen contamination. The sources are heated to their operating temperatures (e.g., about 1300 degrees C.—about 1400 degrees C. for La, about 1650 degrees C.—about 1750 degrees C. for boron, about 1050 degrees C.—about 1150 degrees C. for Al).

A shutter can be provided to avoid exposing the sample to the sources until the deposition is initiated. When the sources have equilibrated at the desired operating temperature and flux, the shutters on both sources are concurrently opened for the time needed to grow a film of the appropriate thickness.

In block 208, a capping layer can optionally be formed on the intermetallic layer. The capping layer can include at least one of aluminum and titanium. In a particularly useful embodiment, the Ti is employed in contact with the intermetallic layer and the Al is formed over the Ti.

In block 210, intermetallic contacts (with or without the capping layer) can be patterned using a lift-off process, patterned using an etch mask and etching the contact material, etc. The intermetallic contacts can be patterned on the carbon nanotube layer by chemical dissolution of the mask layer, in a lift-off process. Other patterning processes are also contemplated. The capping layer(s) can be selectively formed on the contacts or formed and patterned to remove portions of the capping layer with the intermetallic layer.

In block 212, processing continues to complete the device. For example, metal lines and interlevel dielectric materials, etc. are formed.

Having described preferred embodiments for intermetallic contact for carbon nanotube FETs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A field effect transistor, comprising:
 a carbon nanotube layer formed adjacent to a gate structure;
 at least two intermetallic contacts, including an alloy of two or more metals, formed on the carbon nanotube layer, the at least two intermetallic contacts including an oxidation resistant compound having a work function below about 4.4 electron-volts; and
 a conductive cap disposed on each of the at least two intermetallic contacts.

2. The transistor as recited in claim 1, wherein the at least two intermetallic contacts include a metal boride.

3. The transistor as recited in claim 1, wherein the at least two intermetallic contacts include a rare earth boride.

4. The transistor as recited in claim 1, wherein the at least two intermetallic contacts include a material selected from the group consisting of lanthanum boride, cerium boride and samarium boride.

5. The transistor as recited in claim 1, wherein the at least two intermetallic contacts include a rare earth aluminide.

6. The transistor as recited in claim 1, wherein the at least two intermetallic contacts include a material selected from the group consisting of lanthanum aluminide, europium aluminide and strontium aluminide.

7. The transistor as recited in claim 1, wherein the gate structure includes a gate dielectric including an oxygen containing compound.

8. The transistor as recited in claim 1, wherein the gate structure includes a gate electrode that includes a semiconductor substrate.

9. The transistor as recited in claim 1, further comprising a capping layer formed on the at least two intermetallic contacts.

10. The transistor as recited in claim 9, wherein the capping layer includes at least one of aluminum and titanium.

11. A field effect transistor, comprising:
 a substrate forming a back gate;
 a gate dielectric formed over the substrate;
 a carbon nanotube layer formed on the gate dielectric;
 intermetallic contacts formed on the carbon nanotube layer, the intermetallic contacts including a rare earth metal boride or a rare earth metal aluminide; and
 a cladding layer formed over the intermetallic contacts.

12. The transistor as recited in claim 11, wherein the intermetallic contacts include a material selected from the group consisting of lanthanum boride, cerium boride and samarium boride.

13. The transistor as recited in claim 11, wherein the intermetallic contacts include a material selected from the group consisting of lanthanum aluminide, europium aluminide and strontium aluminide.

14. The transistor as recited in claim 11, wherein the gate dielectric includes an oxygen containing compound.

15. The transistor as recited in claim 11, wherein the intermetallic contacts include an oxidation resistance greater than lanthanum.

16. The transistor as recited in claim 11, wherein the intermetallic contacts include a material having a work function below about 4.4 electron-volts.

* * * * *